United States Patent [19]

Ong

[11] Patent Number: 5,798,970
[45] Date of Patent: *Aug. 25, 1998

US005798970A

[54] MEMORY DEVICE OUTPUT BUFFER

[75] Inventor: Adrian E. Ong, San Jose, Calif.

[73] Assignee: Micron Technology, Inc., Boise, Id.

[ * ] Notice: The term of this patent shall not extend beyond the expiration date of Pat. No. 5,602,783.

[21] Appl. No.: 781,198

[22] Filed: Jan. 9, 1997

Related U.S. Application Data

[63] Continuation of Ser. No. 595,370, Feb. 1, 1996, Pat. No. 5,602,783.
[51] Int. Cl.$^6$ .................................................. G11C 11/40
[52] U.S. Cl. .......................... 365/189.05; 365/189.11; 365/149; 326/57
[58] Field of Search ........................ 365/189.05, 189.11, 365/230.08, 149; 326/57, 56, 58

[56] References Cited

U.S. PATENT DOCUMENTS

| | | | |
|---|---|---|---|
| 5,513,140 | 4/1996 | Merritt | 365/189.11 |
| 5,559,452 | 9/1996 | Saito | 365/189.05 |
| 5,587,671 | 12/1996 | Zagar et al. | 365/189.05 |

*Primary Examiner*—David C. Nelms
*Assistant Examiner*—Vu A. Le
*Attorney, Agent, or Firm*—Seed and Berry LLP

[57] ABSTRACT

An output buffer stores a supply voltage on a capacitor when an input is a logic "0", and boosts a boot voltage at the capacitor's first terminal above the supply voltage by an NMOS threshold voltage when the input is a logic "1". A PMOS transistor receives the boot voltage at its source and outputs the boot voltage at its drain when the boot voltage exceeds its gate voltage by a PMOS threshold voltage. A first NMOS transistor couples its drain to ground when its gate voltage exceeds the NMOS threshold voltage. A second NMOS transistor's gate is coupled to the PMOS and first NMOS transistors' drains, and the second NMOS transistor outputs the supply voltage at its source when its gate voltage exceeds the supply voltage by the NMOS threshold voltage. When the input is a logic "1", a control circuit drops the PMOS and first NMOS transistor's gate voltages to ground, thereby applying the boot voltage at the second NMOS transistor's gate and causing the second NMOS transistor to output the supply voltage. When the input is a logic "0", the control circuit raises the PMOS transistor's gate voltage to the supply voltage. The control circuit also raises the first NMOS transistor's gate voltage above the NMOS threshold voltage, but does so only after the boot voltage exceeds the PMOS transistor's gate voltage by less than the PMOS threshold voltage. Thus, the capacitor cannot discharge to ground because the PMOS and first NMOS transistors are never on simultaneously.

27 Claims, 2 Drawing Sheets

MEMORY DEVICE OUTPUT BUFFER

CROSS-REFERENCE TO RELATED APPLICATION

This application is a continuation of U.S. patent application Ser. No. 08/595,370, filed Feb. 1, 1996, U.S. Pat. No. 5,602,783.

FIELD OF THE INVENTION

This invention relates in general to memory devices, and in particular to output buffers for memory devices.

BACKGROUND OF THE INVENTION

Dynamic random access memories (DRAM's) output data bits stored in their arrays through output buffers. Typically, an output buffer receives a data bit from a DRAM's array on the DRAM's internal input/output (I/O) bus. The output buffer then outputs the data bit by driving an external data bus. If the data bit is a logic "1" bit, it is desirable for the output buffer to drive the external data bus to a voltage at or near the supply voltage so the data bit will properly read as a logic "1" bit. A typical supply voltage is 3.3 volts.

A conventional output buffer 10 capable of driving an external data bus (not shown) to the supply voltage is shown in FIG. 1. Although the output buffer 10 shown in FIG. 1 is only capable of a high impedance state and a logic "1" state as described below, it will be understood that other well-known circuitry (not shown) is typically included in the output buffer 10 to make it capable of a logic "0" state as well.

During a DRAM's column address strobe precharge time $t_{CP}$, the output buffer 10 is in a high impedance state. In this state, a low control signal QED* drives the output of an inverter 12 high, causing a NOR gate 14 to output a low. The low output of the NOR gate 14 drives the output of an inverter 16 high. The high output of the inverter 16 applied at the gate of an NMOS transistor 18 turns the NMOS transistor 18 on. The NMOS transistor 18 then couples the gate of an NMOS transistor 20 to ground, thereby turning off the NMOS transistor 20. As a result, a buffered data output DQ floats.

At the same time, the low output of the NOR gate 14 drives the output of an inverter 22 high. The high output of the inverter 22 applied at the gate of a PMOS transistor 24 turns the PMOS transistor 24 off, thereby isolating the NMOS transistors 18 and 20 from a first terminal 26 of a boot capacitor 28. The high output of the inverter 22 also causes an inverter 30 to output a low, thus grounding a second terminal 32 of the boot capacitor 28.

The low output of the NOR gate 14 during the high impedance state also drives the output of an inverter 34 high to a word-line voltage $V_{WL}$ such as 5.0 volts. Because the word-line voltage $V_{WL}$ is significantly greater than the supply voltage $V_{CC}$, the high output of the inverter 34 applied at the gate of an NMOS transistor 36 turns on the NMOS transistor 36 and causes it to apply the full supply voltage $V_{CC}$ to the first terminal 26 of the boot capacitor 28. This in turn causes the boot capacitor 28 to store the supply voltage $V_{CC}$ during the DRAM's column address strobe precharge time $t_{CP}$.

At a later time, the output buffer 10 may switch to a state in which it outputs a logic "0" bit, although a "pull down" circuit which typically drives the output of the buffer 10 to a logic "0" level is not shown in FIG. 1. In this logic "0" state, a high input signal LDQ* representing the logic "0" bit from the DRAM's array (not shown) causes the boot capacitor 28 to store the supply voltage $V_{CC}$ in the same way that the low control signal QED* does during the high impedance state described above.

The output buffer 10 may also switch at a later time to a state in which it outputs a logic "1" bit. In this logic "1" state, a high control signal QED* causes the inverter 12 to output a low. At the same time, a low input signal LDQ* representing the logic "1" bit from the DRAM's array (not shown) together with the low output from the inverter 12 drives the output of the NOR gate 14 high.

The high output of the NOR gate 14 causes the inverter 16 to output a low, and this low output applied at the gate of the NMOS transistor 18 turns off the NMOS transistor 18, thereby isolating the gate of the NMOS transistor 20 from ground. The high output of the NOR gate 14 also causes the inverter 34 to output a low, and this low output applied at the gate of the NMOS transistor 36 turns off the NMOS transistor 36, thereby isolating the first terminal 26 of the boot capacitor 28 from the supply voltage $V_{CC}$.

At the same time, the high output of the NOR gate 14 during the logic "1" state causes the inverter 22 to output a low, thereby driving the output of the inverter 30 high. The high output of the inverter 30 drives the second terminal 32 of the boot capacitor 28 to the supply voltage $V_{CC}$. Because the boot capacitor 28 stored the supply voltage $V_{CC}$ during the DRAM's column address strobe precharge time $t_{CP}$ as described above, the supply voltage $V_{CC}$ at the boot capacitor's second terminal 32 "boots" a boot voltage $V_{BOOT}$ at the boot capacitor's first terminal 26 well above the supply voltage $V_{CC}$.

The low output of the inverter 22 applied at the gate of the PMOS transistor 24 turns the PMOS transistor 24 on, thereby causing it to apply the boot voltage $V_{BOOT}$ at the gate of the NMOS transistor 20. Because the boot voltage $V_{BOOT}$ is well above the supply voltage $V_{CC}$, it turns the NMOS transistor 20 on and causes the NMOS transistor 20 to output a buffered signal at the DQ output at the full supply voltage $V_{CC}$. The output buffer 10 then drives an external data bus (not shown) to the supply voltage $V_{CC}$ with the buffered signal at the DQ output. Thus, in its logic "1" state the output buffer 10 is able to drive the external data bus (not shown) to the supply voltage $V_{CC}$ as a result of the boot capacitor 28 storing the full supply voltage $V_{CC}$ previous to the logic "1" state and then generating the high boot voltage $V_{BOOT}$ during the logic "1" state.

Although the prior art circuit shown in FIG. 1 generally is considered satisfactory, it has been discovered that the boot capacitor 28 tends to discharge its stored voltage during operation of the output buffer 10. Generally, this has not been a problem when the output buffer 10 outputs a variety of logic "1" and "0" bits because the output buffer 10 recharges the boot capacitor 28 in its logic "0" state as described above.

This also generally has not been a problem when the output buffer 10 outputs a series of logic "1" bits, because the output buffer 10 recharges the boot capacitor 28 between the logic "1" bits during the column address strobe precharge time $t_{CP}$ as described above. However, current DRAM column address strobe precharge times $t_{CP}$ which approach 10 nS do not give the typical output buffer 10 enough time to fully recharge the boot capacitor 28 between the logic "1" bits. As a result, the boot capacitor 28 partially discharges when the output buffer 10 outputs each logic "1" bit, causing the boot voltage $V_{BOOT}$ to increasingly "droop"

for each successive logic "1" bit. In turn, the drooping boot voltage $V_{BOOT}$ eventually causes the NMOS transistor 20 to output the buffered signal DQ at less than the fill supply voltage $V_{CC}$. Unfortunately, this may cause some of the logic "1" bits to be misread as logic "0" bits.

Therefore, there is a need in the art for an output buffer which can consistently output a series of logic "1" bits at a voltage near the supply voltage.

SUMMARY OF THE INVENTION

An inventive output buffer includes a charging circuit coupling a boot capacitor's first terminal to a supply voltage when an input signal is inactive and isolating the first terminal from the supply voltage when the input signal is active. A boot circuit couples the boot capacitor's second terminal to a reference potential when the input signal is inactive and to a bias voltage greater than the reference potential by at least a pull-up transistor's threshold voltage when the input signal is active. As a result, the boot and charging circuits store the supply voltage less the reference potential on the boot capacitor when the input signal is inactive and boost a boot voltage at the boot capacitor's first terminal greater than the supply voltage by at least the pull-up transistor's threshold voltage when the input signal is active.

A pass transistor receives the boosted boot voltage at its input terminal and outputs the boosted boot voltage at its output terminal when the boosted boot voltage is greater than a pass control voltage at its control terminal by at least the pass transistor's threshold voltage. Otherwise, the pass transistor isolates its output terminal from the boot voltage. A pull-down transistor couples its output terminal to the reference potential when a pull-down control voltage at its control terminal is greater than the reference potential by at least the pull-down transistor's threshold voltage. Otherwise, the pull-down transistor isolates its output terminal from the reference potential. The pull-up transistor has a control terminal coupled to the pass and pull-down transistors' output terminals, and it receives the supply voltage at its supply terminal and outputs a buffered signal at its output terminal at the supply voltage when a voltage (such as the boosted boot voltage) at its control terminal is greater than the supply voltage by at least the pull-up transistor's threshold voltage.

When the input signal is active, a control circuit provides the pass control voltage to the pass transistor at less than the boot voltage by at least the pass transistor's threshold voltage. At the same time, the control circuit provides the pull-down control voltage to the pull-down transistor at greater than the reference potential by less than the pull-down transistor's threshold voltage. As a result, the pull-down transistor isolates the pull-up transistor's control terminal from the reference potential, and the pass transistor supplies the boosted boot voltage to the pull-up transistor's control terminal so the pull-up transistor outputs the buffered signal at the supply voltage.

When the input signal is inactive, the control circuit provides the pass control voltage to the pass transistor at greater than the reference potential by the supply voltage. The control circuit also provides the pull-down control voltage to the pull-down transistor at greater than the reference potential by at least the pull-down transistor's threshold voltage, but does so only when a feedback voltage received from one of the boot capacitor's terminals corresponds to the boot voltage being greater than the pass control voltage by less than the pass transistor's threshold voltage.

As a result, the pass and pull-down transistors are never on at the same time, thereby preventing the boot capacitor from discharging through the pass and pull-down transistors to the reference potential.

DETAILED DESCRIPTION OF THE INVENTION

Figure 1:
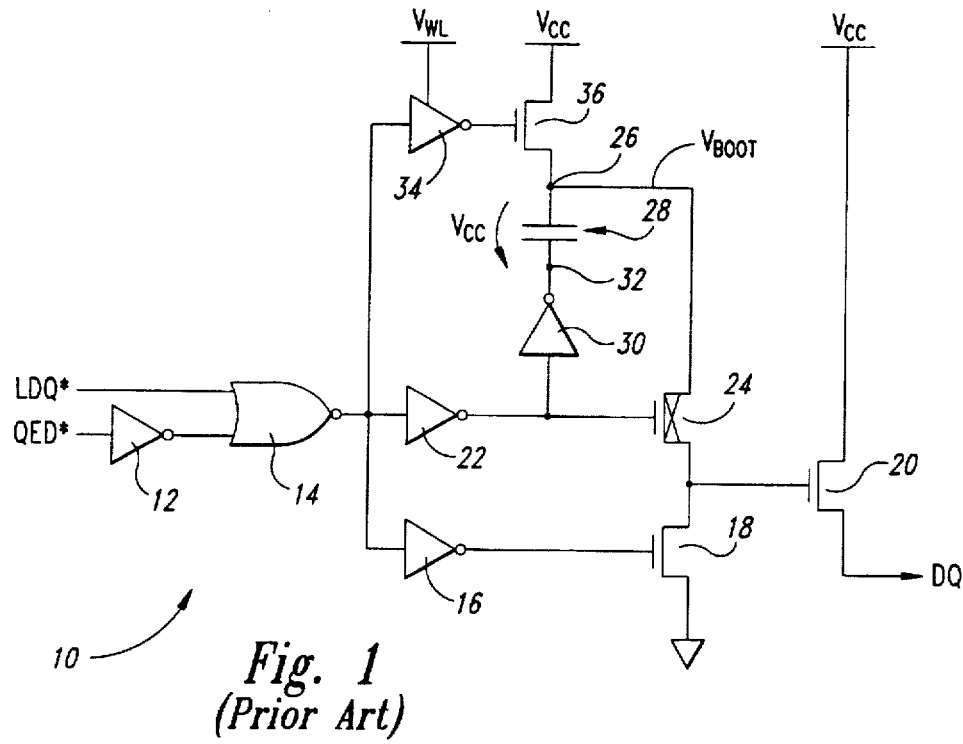
FIG. 1 is a schematic of a prior art output buffer.

The inventor has discovered that, under some conditions, the boot capacitor 28 shown in FIG. 1 partially discharges when the output buffer 10 switches from the logic "1" state (in which the input signal LDQ* is low) to the high impedance state (in which the input signal LDQ* is high). This discharge occurs as follows.

As described above, in the logic "1" state the low input signal LDQ* and the high control signal QED* drive the output of the NOR gate 14 high, causing the inverter 22 to output a low. The low output of the inverter 22 applied at the gate of the PMOS transistor 24 turns the PMOS transistor 24 on.

When the input signal LDQ* changes to high, the output buffer 10 begins to change to the high impedance state. The high input signal LDQ* causes the NOR gate 14 to output a low, thereby driving the outputs of the inverters 16 and 22 toward the supply voltage $V_{CC}$. The rising output of the inverter 22 drives the output of the inverter 30 and the second terminal 32 of the boot capacitor 28 toward ground, thereby causing the boot voltage $V_{BOOT}$ at the boot capacitor's first terminal 26 to fall toward the supply voltage $V_{CC}$ previously stored on the boot capacitor 28. At the same time, the high output of the inverter 16 starts turning on the NMOS transistor 18, and the high output of the inverter 22 attempts to turn off the PMOS transistor 24. However, the high ($V_{CC}$ voltage) applied to the gate of the PMOS transistor 24 cannot turn off the transistor 24 until the boot voltage $V_{BOOT}$ falls substantially to $V_{CC}$. There is often a delay in driving the voltage at the second terminal 32 of the boot capacitor 28 to ground so that the boot voltage $V_{BOOT}$ remains sufficiently above $V_{CC}$ to maintain the PMOS transistor 24 on after the NMOS transistor 18 is turned on. Under these circumstances, the boot capacitor 28 partially discharges to ground through the PMOS transistor 24 and the NMOS transistor 18. Shortly thereafter, when the difference between the falling boot voltage $V_{BOOT}$ and the rising output of the inverter 22 is less than the magnitude of the threshold voltage of the PMOS transistor 24, the PMOS transistor 24 turns off and the boot capacitor 28 stops discharging to ground.

Figure 2:
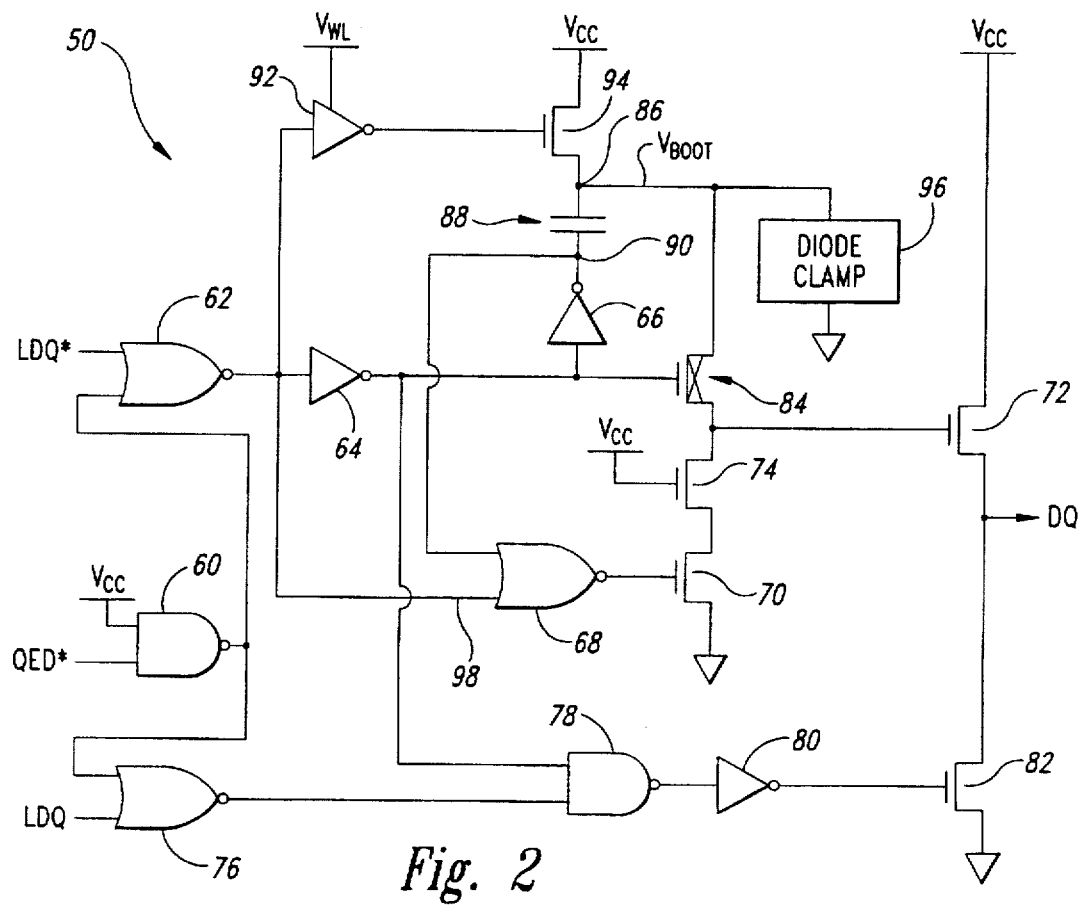
FIG. 2 is a schematic of a preferred output buffer according to the present invention.

The present invention solves this problem. In general, a preferred output buffer 50 shown in FIG. 2 stores a supply voltage $V_{CC}$ in a high impedance state during the column address strobe precharge time $t_{CP}$ of a memory device (shown in FIG. 3), outputs a logic "1" bit in a logic "1" state, and then prevents the stored supply voltage $V_{CC}$ from discharging when switching from the logic "1" state back to the high impedance state.

In the high impedance state of the output buffer 50, the supply voltage $V_{CC}$ is stored as follows. A low control signal QED* drives the output of a NAND gate 60 high, causing a NOR gate 62 to output a low. The low output of the NOR gate 62 drives the output of an inverter 64 high, causing an inverter 66 to output a low. The low output of the inverter 66 together with the low output of the NOR gate 62 drives the output of a NOR gate 68 high, causing a pull-down NMOS transistor 70 to turn on. When on, the pull-down NMOS transistor 70 couples the gate of a pull-up NMOS transistor 72 to ground through a resistance-connected NMOS transistor 74, thereby turning off the pull-up NMOS transistor 72.

At the same time, the high output of the NAND gate 60 causes a NOR gate 76 to output a low. The low output of the NOR gate 76 drives the output of a NAND gate 78 high, causing an inverter 80 to output a low. The low output of the inverter 80 applied at the gate of an NMOS transistor 82 turns off the NMOS transistor 82. As a result of the NMOS transistors 72 and 82 being off, a buffered data output DQ floats.

While the output buffer 50 is in the high impedance state, the high output of the inverter 64 applied at the gate of a pass PMOS transistor 84 turns off the pass PMOS transistor 84, thereby isolating the NMOS transistors 70, 72 and 74 from a first terminal 86 of a boot capacitor 88. Also, the low output of the inverter 66 grounds a second terminal 90 of the boot capacitor 88. At the same time, the low output of the NOR gate 62 drives the output of an inverter 92 high to a word-line voltage $V_{WL}$ such as 5.0 volts. Because the word-line voltage $V_{WL}$ is significantly greater than the supply voltage $V_{CC}$, the high output of the inverter 92 applied at the gate of a charging NMOS transistor 94 turns on the charging NMOS transistor 94 and causes it to apply the full supply voltage $V_{CC}$ to the first terminal 86 of the boot capacitor 88. As a result, the boot capacitor 88 stores the supply voltage $V_{CC}$.

At a later time, the output buffer 50 may switch to its logic "1" state and output a logic "1" bit as follows. A high input signal LDQ representing the logic "1" bit from a memory array (FIG. 3) causes the NOR gate 76 to output a low, thereby driving the output of the NAND gate 78 high and the output of the inverter 80 low. The low output of the inverter 80 applied at the gate of the NMOS transistor 82 turns off the NMOS transistor 82, thereby isolating the buffered data output DQ from ground.

Also, a high control signal QED* from a control bus (FIG. 3) causes the NAND gate 60 to output a low. The low output of the NAND gate 60 together with a low input signal LDQ* also representing the logic "1" bit from the memory array (FIG. 3) drives the output of the NOR gate 62 high.

The high output of the NOR gate 62 causes the NOR gate 68 to output a low, and this low output applied at the gate of the pull-down NMOS transistor 70 turns off the pull-down NMOS transistor 70, thereby isolating the gate of the pull-up NMOS transistor 72 from ground. The high output of the NOR gate 62 also causes the inverter 92 to output a low, and this low output applied at the gate of the charging NMOS transistor 94 turns off the charging NMOS transistor 94, thereby isolating the first terminal 86 of the boot capacitor 88 from the supply voltage $V_{CC}$.

At the same time, the high output of the NOR gate 62 during the logic "1" state causes the inverter 64 to output a low, thereby driving the output of the inverter 66 high. The high output of the inverter 66 drives the second terminal 90 of the boot capacitor 88 to the supply voltage $V_{CC}$. Because the boot capacitor 88 stored the supply voltage $V_{CC}$ during the high impedance state as described above, the supply voltage $V_{CC}$ at the boot capacitor's second terminal 90 "boots" a boot voltage $V_{BOOT}$ at the boot capacitor's first terminal 86 well above the supply voltage $V_{CC}$. A diode clamp 96 typically limits the booted boot voltage $V_{BOOT}$ to about four NMOS threshold voltages above the supply voltage $V_{CC}$ ($V_{BOOT} \leq V_{CC} + 4V_T$). The supply voltage $V_{CC}$ at the boot capacitor's second terminal 90 also assists the high output of the NOR gate 62 in driving the output of the NOR gate 68 low, and thereby assists in turning the pull-down NMOS transistor 70 off.

The low output of the inverter 64 applied at the gate of the pass PMOS transistor 84 turns on the pass PMOS transistor 84, thereby causing it to apply the boot voltage $V_{BOOT}$ at the gate of the pull-up NMOS transistor 72. Because the boot voltage $V_{BOOT}$ is well above the supply voltage $V_{CC}$, it turns on the pull-up NMOS transistor 72 and causes the pull-up NMOS transistor 72 to output the buffered data output DQ at the full supply voltage $V_{CC}$. The output buffer 50 then drives an external data bus (FIG. 3) to the supply voltage $V_{CC}$ with the buffered data output DQ. As a result, the buffered data output DQ outputs the logic "1" bit.

When the logic "1" state is finished, the control signal QED* changes to low and causes the output buffer 50 to begin to switch back to the high impedance state. As described below, while the output buffer 50 switches, the boot capacitor 88 does not discharge because the output buffer 50 prevents the transistor 70 from turning on until the transistor 84 turns off.

The low control signal QED* drives the output of the NAND gate 60 high, causing the NOR gate 62 to output a low. The low output of the NOR gate 62 causes an input 98 of the NOR gate 68 to go low and drives the output of the inverter 64 high. The low input 98 then enables the NOR gate 68 so that its output may subsequently go high to turn on the pull-down NMOS transistor 70. The high output of the inverter 64 also simultaneously attempts to turn off the PMOS transistor 84, and it starts to drive the output of the inverter 66 low, thereby driving the second terminal 90 toward $V_{CC}$. However, even though the output of the inverter 64 is high at $V_{CC}$, the PMOS transistor 84 does not immediately turn off because the voltage at the first terminal 86 is above $V_{CC}$. The PMOS transistor 84 does not turn off until the voltage at the first terminal 86 falls to substantially $V_{CC}$. The voltage on the terminal 86 does not reach $V_{CC}$ until the inverter 66 pulls the voltage on the second terminal 90 low to about zero volts.

However, because the NOR gate 68 is coupled to the boot capacitor's second terminal 90, the output of the NOR gate 68 cannot go high and thereby turn on the pull-down NMOS transistor 70 until the voltage at the second terminal 90 falls substantially to ground. Before the voltage at the second terminal 90 can fall substantially to ground as a result of the high output of the inverter 64 driving the output of the inverter 66 low, the voltage at the second terminal 90 falls enough to cause the boot voltage $V_{BOOT}$ at the first terminal 86 to fall sufficiently to turn off the pass PMOS transistor 84. Shortly thereafter, the voltage at the second terminal 90 falls substantially to ground, thereby driving the output of the NOR gate 68 high and turning on the pull-down NMOS transistor 70.

Thus, the boot capacitor 88 never has the opportunity to discharge to ground when the output buffer 50 switches from its logic "1" state to its high impedance state, because feedback from the second terminal 90 of the boot capacitor 88 doesn't allow the pull-down NMOS transistor 70 to turn on until the pass PMOS transistor 84 turns off. Therefore, the inventive output buffer 50 can consistently output logic "1" bits at a voltage near the supply voltage.

Figure 3:
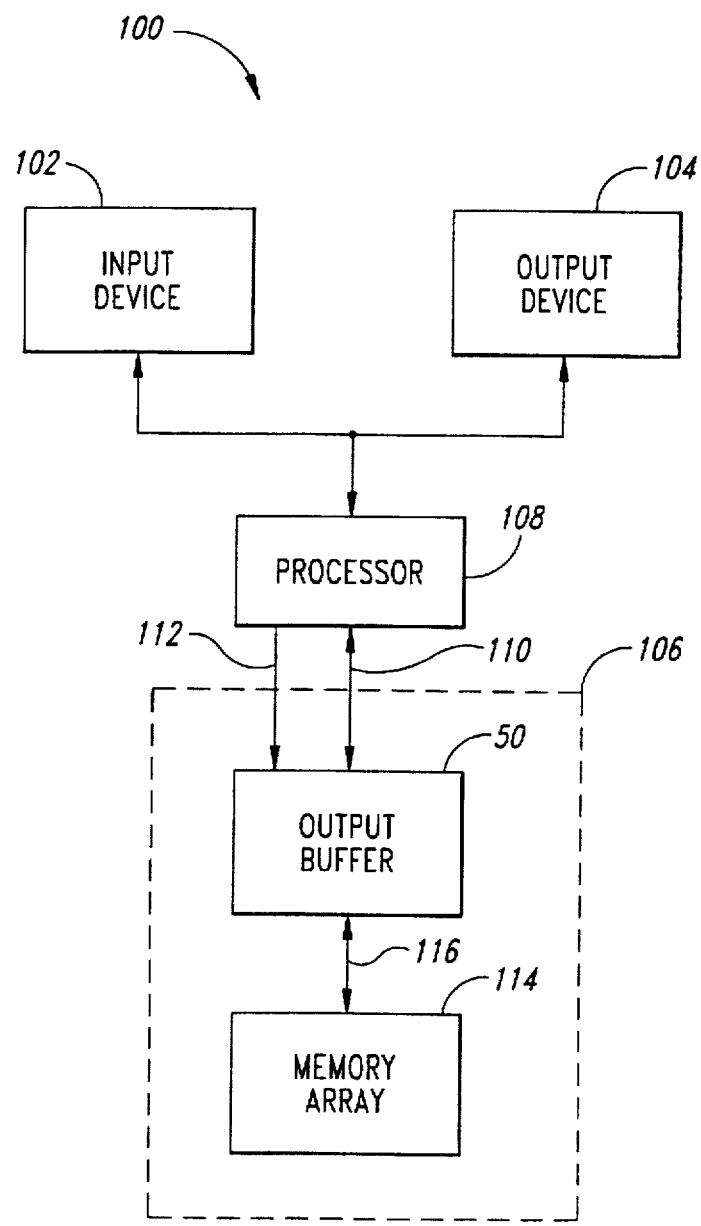
FIG. 3 is a block diagram of a computer system including the preferred output buffer of FIG. 2.

As shown in FIG. 3, a computer system 100 including the output buffer 50 has an input device 102, such as a keyboard, an output device 104, such as a computer display, a memory device 106, such as a DRAM, and a processor 108 coupled to the input device 102, the output device 104 and the memory device 106. The memory device 106 includes the output buffer 50 coupled to the processor 108 through an external data bus 110 and a control bus 112, and a memory array 114 coupled to the output buffer 50 through an internal I/O bus 116.

Although the present invention has been described with reference to a preferred embodiment, the invention is not limited to this preferred embodiment. Rather, the invention is limited only by the appended claims, which include within their scope all equivalent devices or methods which operate according to the principles of the invention as described.

I claim:

1. A control circuit adapted for use in an output buffer of a memory device, the control circuit comprising:

a boot capacitor having first and second terminals;

a charge circuit coupled to an input terminal of the control circuit and to the first terminal of the boot capacitor, the charge circuit coupling a charging current to or from the first terminal of the boot capacitor responsive to a first input voltage being applied to the input terminal;

a drive circuit coupled to the input terminal and the second terminal of the boot capacitor, the drive circuit driving the second terminal of the boot capacitor between a first voltage responsive to the first input voltage being applied to the input terminal and a second voltage responsive to a second input voltage being applied to the input terminal of the control circuit;

a first switch coupled between the first terminal of the boot capacitor and a control node, the first switch having a control terminal coupled to the input terminal of the control circuit, the first switch being non-conductive responsive to the first input voltage being applied to the input terminal of the control circuit and being conductive responsive to the second input voltage being applied to the input terminal of the output buffer; and a second switch coupled between the control node and a reference voltage, the second switch having a control terminal coupled to the second terminal of the boot capacitor, the second switch being conductive responsive to the second terminal of the boot capacitor being at the first voltage and non-conductive responsive to the second terminal of the boot capacitor being at other than the first voltage.

2. The control circuit of claim 1 wherein the drive circuit comprises an inverter having an input coupled to the input terminal of the control circuit and an output terminal coupled to the second terminal of the boot capacitor.

3. The control circuit of claim 1 wherein the second switch comprises:

a MOSFET transistor having a source and a drain coupled between the control node and the reference voltage, the MOSFET transistor further having a gate receiving a voltage to control the conductivity between the source and the drain; and a logic circuit having a first input terminal coupled to the second terminal of the boot capacitor, a second input terminal coupled to the input terminal of the control circuit, and an output terminal coupled to the gate of the MOSFET transistor, the logic circuit generating a signal at its output terminal to turn on the MOSFET transistor responsive to the first input voltage being applied to the input terminal of the control circuit and the second terminal of the boot capacitor being at the first voltage, the logic circuit generating a signal at its output terminal to turn off the MOSFET transistor responsive to either the second input voltage being applied to the input terminal of the control circuit or the second terminal of the boot capacitor being at other than the first voltage.

4. The control circuit of claim 1 wherein the first and second switches comprise respective first and second field effect transistors, the gate of the first transistor being coupled to the input terminal of the control circuit and the gate of the second transistor being coupled to the second terminal of the boot capacitor.

5. The control circuit of claim 4 wherein the first transistor comprises a PMOS transistor and the second transistor comprises an NMOS transistor.

6. The control circuit of claim 1 wherein the reference voltage comprises ground potential.

7. The control circuit of claim 1 wherein the charging circuit comprises a MOSFET transistor coupled between a supply voltage and the first terminal of the capacitor, the MOSFET transistor having its gate coupled to the input terminal of the control circuit so that the MOSFET transistor is turned on responsive to the first input voltage being applied to the input terminal of the control circuit.

8. A memory device output buffer, comprising:

a boot capacitor having first and second terminals;

a charge circuit coupled to an input terminal of the buffer and the first terminal of the boot capacitor, the charge circuit coupling a charging current to or from the first terminal of the boot capacitor responsive to a first input voltage being applied to the input terminal;

a drive circuit having an input coupled to the input terminal of the buffer and an output terminal coupled to the second terminal of the boot capacitor, the drive circuit driving the second terminal of the boot capacitor between a first voltage responsive to the first input voltage being applied to the input terminal of the buffer and a second voltage responsive to a second input voltage being applied to the input terminal of the buffer;

a first switch coupled between the first terminal of the boot capacitor and a control node, the first switch having a control terminal coupled to the input terminal, the first switch being non-conductive responsive to the first input voltage being applied to the input terminal of the buffer and being conductive responsive to the second input voltage being applied to the input terminal of the buffer; and a second switch coupled between the control node and a first reference voltage, the second switch having a control terminal coupled to the second terminal of the boot capacitor, the second switch being conductive responsive to the second terminal of the boot capacitor being at the first voltage, the second switch being non-conductive responsive to the second terminal of the boot capacitor being at other than the first voltage;

a third switch coupled between a supply voltage and an output node, the third switch having a control terminal coupled to the control node, the third switch being conductive responsive to the first switch being conductive to couple the first terminal of the boot capacitor to the control terminal of the third switch; and a fourth switch coupled between the output node and a second reference voltage, the fourth switch having a control terminal coupled to the input terminal, the fourth switch being conductive responsive to the first input voltage being applied to the input terminal of the buffer.

9. The output buffer of claim 8 wherein the drive circuit comprises an inverter having an input terminal coupled to the input terminal of the buffer and an output terminal coupled to the second terminal of the boot capacitor.

10. The output buffer of claim 8 wherein the second switch comprises:
a MOSFET transistor having a source and a drain coupled between the control node and the reference voltage, the MOSFET transistor further having a gate receiving a voltage to control the conductivity between the source and the drain; and
a logic circuit having a first input terminal coupled to the second terminal of the boot capacitor, a second input terminal coupled to the input terminal of the buffer, and an output terminal coupled to the gate of the MOSFET transistor, the logic circuit generating a signal at its output terminal to turn on the MOSFET transistor responsive to the first input voltage being applied to the input terminal of the buffer and the second terminal of the boot capacitor being at the first voltage, the logic circuit generating a signal at its output terminal to turn off the MOSFET transistor responsive to either the second input voltage being applied to the input terminal of the buffer or the second terminal of the boot capacitor being at other than the first voltage.

11. The output buffer of claim 8 wherein the first and second switches comprise respective first and second field effect transistors, the gate of the first transistor being coupled to the input terminal of the buffer and the gate of the second transistor being coupled to the second terminal of the boot capacitor.

12. The output buffer of claim 11 wherein the first transistor comprises a PMOS transistor and the second transistor comprises an NMOS transistor.

13. The output buffer of claim 8 wherein the third and fourth switches comprise respective NMOS transistors.

14. The output buffer of claim 8 wherein the first and second reference voltages comprises ground potential.

15. The output buffer of claim 8 wherein the charging circuit comprises a MOSFET transistor coupled between the supply voltage and the first terminal of the capacitor, the MOSFET transistor having its gate coupled to the input terminal of the buffer so that the MOSFET transistor is turned on responsive to the first input voltage being applied to the input terminal of the buffer.

16. A memory device having an address bus, and at least one data bit terminal, comprising:
an memory array having a plurality of memory cells, a plurality of row lines, a plurality of complimentary digit lines, and at least one data port;
addressing circuits adapted to receive a row and column address on the address bus and activate a corresponding one of the memory cells;
a data path coupled between a data terminal of the memory array and the data bit port of the memory device, the data path including a input data buffer adapted to couple an input data signal from the data bit port to the data terminal of the memory array, and an output data buffer adapted to couple an output data signal from the data terminal of the memory array to the data bit port, the output buffer comprising:
a boot capacitor having first and second terminals;

a charge circuit coupled to the data terminal of the memory array and the first terminal of the boot capacitor, the charge circuit coupling a charging current to or from the first terminal of the boot capacitor responsive to a first output data signal from the data terminal of the memory array;
a drive circuit coupled to the data terminal of the memory array and the second terminal of the boot capacitor, the drive circuit driving the second terminal of the boot capacitor between a first voltage responsive to the first output data signal from the data terminal of the memory array and a second voltage responsive to a second data output signal from the data terminal of the memory array;
a first switch coupled between the first terminal of the boot capacitor and a control node, the first switch having a control terminal coupled to the data terminal of the memory array, the first switch being non-conductive responsive to the first data output signal from the data terminal of the memory array and being conductive responsive to the second data output signal from the data terminal of the memory array;
a second switch coupled between the control node and a first reference voltage, the second switch having a control terminal coupled to the second terminal of the boot capacitor, the second switch being conductive responsive to the second terminal of the boot capacitor being at the first voltage, the second switch being non-conductive responsive to the second terminal of the boot capacitor being at other than the first voltage;
a third switch coupled between a supply voltage and the data bit port, the third switch having a control terminal coupled to the, control node the third switch being conductive responsive to the first switch being conductive to couple the first terminal of the boot capacitor to the control terminal of the third switch; and
a fourth switch coupled between the data bit port and a second reference voltage, the fourth switch having a control terminal coupled to the data terminal of the array, the fourth switch being conductive responsive to the second data output signal from the data terminal of the memory array.

17. The memory device of claim 16 wherein the drive circuit comprises an inverter having an input terminal coupled to the data terminal of the memory array and an output terminal coupled to the second terminal of the boot capacitor.

18. The memory device of claim 16 wherein the second switch comprises:
a MOSFET transistor having a source and a drain coupled between the control node and the first reference voltage, the MOSFET transistor further having a gate receiving a voltage to control the conductivity between the source and the drain; and
a logic circuit having a first input terminal coupled to the second terminal of the boot capacitor, a second input terminal coupled to the data terminal of the memory array, and an output terminal coupled to the gate of the MOSFET transistor, the logic circuit generating a signal at its output terminal to turn on the MOSFET transistor responsive to the first input data signal from the data terminal of the memory array and the second terminal of the boot capacitor being at the first voltage, the logic circuit generating a signal at its output terminal to turn off the MOSFET transistor responsive to either the second data output signal from the data terminal of the memory array or the second terminal of the boot capacitor being at other than the first voltage.

19. The memory device of claim 16 wherein the first and second switches comprise respective first and second field effect transistors, the gate of the first transistor being coupled to the data terminal of the memory array and the gate of the second transistor being coupled to the second terminal of the boot capacitor.

20. The memory device of claim 19 wherein the first transistor comprises a PMOS transistor and the second transistor comprises an NMOS transistor.

21. The memory device of claim 16 wherein the third and fourth switches comprises respective NMOS transistors.

22. The memory device of claim 16 wherein the first and second reference voltages comprises ground potential.

23. A method of generating a control voltage in a memory device output buffer, the method comprising:

charging or discharging a boot capacitor by coupling a charging current to or from a first terminal of the boot capacitor responsive to a first input signal applied to an input terminal of the output buffer;

driving a second terminal of the boot capacitor between a first voltage responsive to the first input signal being applied to the input terminal of the output buffer and a second voltage responsive to a second input signal being applied to the input terminal of the output buffer;

isolating the first terminal of the boot capacitor from a control node responsive to the first input signal applied to the input terminal of the output buffer;

coupling the first terminal of the boot capacitor to the control node responsive to the second input signal applied to the input terminal of the output buffer;

coupling the control node to a reference voltage responsive to the second terminal of the boot capacitor being at the first voltage; and isolating the control node from the reference voltage responsive to the second terminal of the boot capacitor being at other than the first voltage.

24. The method of claim 23 wherein the step of isolating the control node from the reference voltage comprises isolating the control node from the reference voltage responsive to the boot capacitor being at the second voltage.

25. The method of claim 23 wherein the step of isolating the control node from the reference voltage comprises isolating the control node from the reference voltage responsive to either the second terminal of the boot capacitor being at other than the first voltage or the second input signal being applied to the input terminal of the output buffer.

26. The method of claim 23 wherein the step of coupling the control node to the reference voltage comprises coupling the control node to the reference voltage responsive to both the first input signal being applied to the input terminal of the output buffer and the second terminal of the boot capacitor being at the first voltage.

27. The method of claim 23 wherein the step of charging or discharging the boot capacitor comprises coupling a supply voltage to the first terminal of the boot capacitor to charge the boot capacitor responsive to the first input signal applied to the input terminal of the output buffer.

* * * * *

UNITED STATES PATENT AND TRADEMARK OFFICE
CERTIFICATE OF CORRECTION

PATENT NO. : 5,798,970
DATED : August 25, 1998
INVENTOR(S) : Ong

It is certified that error appears in the above-identified patent and that said Letters Patent is hereby corrected as shown below:

Column 4, line 19    "die"             -- the --

Column 10, line 33   "the, control mode"    -- the control mode, --

Signed and Sealed this

Twenty-ninth Day of May, 2001

Attest:

NICHOLAS P. GODICI

Attesting Officer    Acting Director of the United States Patent and Trademark Office